(12) United States Patent
Sung

(10) Patent No.: US 12,126,207 B2
(45) Date of Patent: Oct. 22, 2024

(54) BATTERY CONTROLLER, WIRELESS BATTERY CONTROL SYSTEM, BATTERY PACK, AND BATTERY BALANCING METHOD

(71) Applicant: LG ENERGY SOLUTION, LTD., Seoul (KR)

(72) Inventor: Chang-Hyun Sung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 698 days.

(21) Appl. No.: 17/417,277

(22) PCT Filed: May 7, 2020

(86) PCT No.: PCT/KR2020/006046
§ 371 (c)(1),
(2) Date: Jun. 22, 2021

(87) PCT Pub. No.: WO2020/226441
PCT Pub. Date: Nov. 12, 2020

(65) Prior Publication Data
US 2022/0077710 A1    Mar. 10, 2022

(30) Foreign Application Priority Data

May 7, 2019   (KR) .................. 10-2019-0053177
May 4, 2020   (KR) .................. 10-2020-0053359

(51) Int. Cl.
*H02J 7/00*   (2006.01)
*B60L 58/22*  (2019.01)
(Continued)

(52) U.S. Cl.
CPC ........ *H02J 7/007182* (2020.01); *B60L 58/22* (2019.02); *G01R 31/382* (2019.01);
(Continued)

(58) Field of Classification Search
CPC ............ H02J 7/007182; H02J 7/00032; H02J 7/0016; H02J 7/0029; H02J 7/0048;
(Continued)

(56) References Cited

U.S. PATENT DOCUMENTS 9,373,953 B2    6/2016   Kimura
2008/0284375 A1  11/2008  Nagaoka et al.
(Continued)

FOREIGN PATENT DOCUMENTS

EP    3 252 864 A1    12/2017
JP    2008-289234 A   11/2008
(Continued)

OTHER PUBLICATIONS

Extended European Search Report issued from the European Patent Office dated Feb. 11, 2022 in corresponding European Patent Application No. 20801938.0.
(Continued)

*Primary Examiner* — Stacy Whitmore
(74) *Attorney, Agent, or Firm* — Morgan, Lewis & Bockius LLP

(57) ABSTRACT

Provided are a battery controller, a wireless battery control system, a battery pack and a battery balancing method. The battery controller is for a battery module comprising a positive terminal, a negative terminal and a plurality of battery cells electrically connected in series between the positive terminal and the negative terminal. The battery controller comprises a voltage measuring unit to generate a voltage signal indicating a cell voltage of each of the plurality of battery cells, and a control module. The control module wirelessly transmits sensing data indicating the cell voltage of each of the plurality of battery cells while the control module is operating using a first cell voltage of a
(Continued)

bottommost cell of the plurality of battery cells as power for operating the control module.

17 Claims, 6 Drawing Sheets

(51) Int. Cl.
 *G01R 31/382* (2019.01)
 *G01R 31/392* (2019.01)
 *G01R 31/396* (2019.01)
(52) U.S. Cl.
 CPC ......... *G01R 31/392* (2019.01); *G01R 31/396* (2019.01); *H02J 7/00032* (2020.01); *H02J 7/0016* (2013.01); *H02J 7/0029* (2013.01); *H02J 7/0048* (2020.01); *H02J 7/005* (2020.01)
(58) Field of Classification Search
 CPC .......... H02J 7/005; H02J 1/082; H02J 7/0019; H02J 7/00036; H02J 7/00306; H02J 2310/46; H02J 2207/10; H02J 7/0047; B60L 58/22; G01R 31/382; G01R 31/392; G01R 31/396; G01R 31/371; H01M 10/425; H01M 2010/4271; H01M 2010/4278; H01M 2200/00; H01M 10/4207; H01M 10/482; H01M 10/4257; H01M 10/48; Y02E 60/10; Y02T 10/70
 See application file for complete search history.

(56) References Cited

U.S. PATENT DOCUMENTS

| | | |
|---|---|---|
| 2011/0210700 A1 | 9/2011 | Shimizu |
| 2011/0300415 A1 | 12/2011 | Kumagai et al. |
| 2014/0145682 A1 | 5/2014 | Kim et al. |
| 2014/0210420 A1 | 7/2014 | Lee et al. |
| 2014/0347013 A1 | 11/2014 | Kim |
| 2015/0349547 A1* | 12/2015 | Jeon .................. G01R 31/3648 320/134 |
| 2016/0137091 A1 | 5/2016 | Yamazoe et al. |
| 2018/0012484 A1* | 1/2018 | Sakabe .................. G08C 25/00 |
| 2018/0026458 A1 | 1/2018 | Kawamura |
| 2018/0062403 A1 | 3/2018 | Jeon |
| 2018/0212444 A1* | 7/2018 | Mino .................. H01M 10/425 |
| 2018/0337536 A1 | 11/2018 | Li et al. |
| 2019/0074699 A1 | 3/2019 | Yano et al. |
| 2019/0252735 A1 | 8/2019 | Sung et al. |
| 2019/0280489 A1* | 9/2019 | Hidaka .................. H02J 7/0048 |
| 2019/0356143 A1 | 11/2019 | Lee et al. |
| 2020/0076013 A1 | 3/2020 | Sato |
| 2021/0305817 A1* | 9/2021 | Hidaka .................. H02J 7/0014 |
| 2024/0088800 A1* | 3/2024 | Fan ..................... H02M 7/4835 |

FOREIGN PATENT DOCUMENTS

| | | |
|---|---|---|
| JP | 2010-283918 A | 12/2010 |
| JP | 2011-182550 A | 9/2011 |
| JP | 2015-81845 A | 4/2015 |
| JP | 2015-115980 A | 6/2015 |
| JP | 2015-133823 A | 7/2015 |
| JP | 2016-143113 A | 8/2016 |
| JP | 2018-81837 A | 5/2018 |
| JP | 6392088 B2 | 9/2018 |
| KR | 10-2012-0059247 A | 6/2012 |
| KR | 10-2014-0138067 A | 12/2014 |
| KR | 10-1539693 B1 | 7/2016 |
| KR | 10-2017-0069613 A | 6/2017 |
| KR | 10-1780507 B1 | 9/2017 |
| KR | 10-2018-0022404 A | 3/2018 |
| KR | 10-2019-0005407 A | 1/2019 |
| KR | 10-2019-0011568 A | 2/2019 |
| WO | 2013/035176 A1 | 3/2013 |
| WO | 2013/139921 A2 | 9/2013 |
| WO | 2017/073018 A1 | 5/2017 |

OTHER PUBLICATIONS

Office Action issued from the Japanese Patent Office dated Jun. 28, 2022 in corresponding Japanese Patent Application No. 2021-534673.

International Search Report issued in corresponding International Patent Application No. PCT/KR2020/006046, dated Aug. 24, 2020.

* cited by examiner

BATTERY CONTROLLER, WIRELESS BATTERY CONTROL SYSTEM, BATTERY PACK, AND BATTERY BALANCING METHOD

TECHNICAL FIELD

The present disclosure relates to technology that controls a battery module and balances a plurality of battery cells included in the battery module.

The present application claims the benefit of Korean Patent Application No. 10-2019-0053177 filed on May 7, 2019 and Korean Patent Application No. 10-2020-0053359 filed on May 4, 2020 with the Korean Intellectual Property Office, the disclosure of which is incorporated herein by reference in its entirety.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect, and thus they are gaining more attention than nickel-based secondary batteries for their advantages that recharging can be done whenever it is convenient, the self-discharge rate is very low and the energy density is high.

A battery pack used in electric vehicle applications generally includes a plurality of battery modules connected in series and a plurality of battery controllers. Each battery controller monitors and controls the state of the battery module that the battery controller manages. Recently, to meet the demand for high-capacity high-output battery packs, the number of battery modules included in the battery pack also increases. To efficiently manage the state of each battery module included in the battery pack, a single master-multi slave structure is disclosed. The single master-multi slave structure includes a plurality of slave controllers provided to the plurality of battery modules in a one-to-one relationship and a master controller to control the overall operation of the plurality of slave controllers. The master controller is configured to communicate with the plurality of slave controllers via a wireless channel, thereby providing a wireless battery control system.

Each slave controller may be referred to as a 'battery controller', and generally uses a module voltage, namely, a voltage across the battery module corresponding to the slave controller as its operating power. The module voltage (e.g., 12V) of the battery module including a plurality of battery cells is far higher than the upper limit of the voltage range (e.g., between 1.8 and 3.6 V) required to wake up (activate) the slave controller corresponding to the corresponding battery module. Accordingly, each slave controller needs a power supply circuit (for example, a direct current (DC)-DC converter) to drop the module voltage down to the rated voltage required to wake up the slave controller.

DISCLOSURE

Technical Problem

The present disclosure is directed to providing a battery controller that wakes up with power supplied from a specific battery cell in a battery module, thereby making it possible to wirelessly transmit module information without adding a power supply circuit to convert the module voltage of the battery module into the rated voltage required to wake up the battery controller, a wireless battery control system and a battery pack.

These and other objects and advantages of the present disclosure will be understood by the following description and will be apparent from the embodiments of the present disclosure. Further, it will be readily understood that the objects and advantages of the present disclosure can be realized by the means set forth in the appended claims and combinations thereof.

Technical Solution

A battery controller according to an aspect of the present disclosure is for a battery module comprising a positive terminal, a negative terminal and a plurality of battery cells electrically connected in series between the positive terminal and the negative terminal. The battery controller comprises a voltage measuring unit configured to generate a voltage signal indicating a cell voltage of each of the plurality of battery cells, and a control module operably coupled to the voltage measuring unit. The control module is configured to wake up using a first cell voltage of a bottommost cell among the plurality of battery cells as power for operating the control module. The control module is configured to wirelessly transmit sensing data indicating the cell voltage of each of the plurality of battery cells while the control module is operating.

The control module comprises a power input terminal electrically connected to a positive terminal of the bottommost cell, and a reference terminal electrically connected to a negative terminal of the bottommost cell.

The battery controller may further comprise a protection circuit electrically connected between the positive terminal of the bottommost cell and the power input terminal. The protection circuit may be configured to regulate a voltage between the power input terminal and the reference terminal equal to or less than a predetermined set voltage.

The protection circuit may comprise a Zener diode having a first end electrically connected to the positive terminal of the bottommost cell and a second end electrically connected to the power input terminal.

The battery controller may further comprise a balancing circuit electrically connected in parallel to a series cell circuit of the remaining battery cells except the bottommost cell among the plurality of battery cells.

The control module may be configured to determine a reference cell voltage based on the cell voltage of at least one battery cell included in the series cell circuit. The control module may be configured to output a balancing control signal to the balancing circuit when the reference cell voltage is higher than the first cell voltage. The balancing circuit is configured to form a discharge path for the series cell circuit in response to the balancing control signal.

The balancing circuit may comprise a discharge resistor, and a discharge switch connected in series to the discharge resistor. The discharge switch is turned on in response to the balancing control signal.

The control module may be configured to determine a duty cycle of the balancing control signal based on a reference voltage difference that is a voltage obtained by subtracting the first cell voltage from the reference cell voltage.

The control module may be configured to determine the duty cycle using the following Equation 1:

$$D_{B\_V} = \Delta V_1 \times C_1 \qquad \text{[Equation 1]}$$

In Equation 1, $D_{B\_V}$ is the duty cycle, $\Delta V_1$ is the reference voltage difference, and $C_1$ is a predetermined scaling factor.

The battery controller may further comprise a current sensor configured to generate a current signal indicating a current flowing from the positive terminal of the bottommost cell to the power input terminal. The control module may be configured to determine the duty cycle of the balancing control signal further based on the current signal.

The control module may be configured to determine, based on the current signal, a discharge capacity of the bottommost cell for each predetermined monitoring period. The control module may be configured to determine the duty cycle using the following Equation 2:

$$D_{B\_VI} = (\Delta V_1 \times C_1) \times W_1 + (\Delta Q \times C_2) \times W_2 \qquad \text{[Equation 2]}$$

In Equation 2, $D_{B\_VI}$ is the duty cycle, $\Delta V_1$ is the reference voltage difference, $C_1$ is a predetermined first scaling factor, $\Delta Q$ is the discharge capacity, $C_2$ is a predetermined second scaling factor, $W_1$ is a predetermined first weight, and $W_2$ is a predetermined second weight.

A wireless battery control system according to another aspect of the present disclosure comprises the battery controller.

A battery pack according to still another aspect of the present disclosure comprises the wireless battery control system.

A battery balancing method for a plurality of battery cells connected in series between a positive terminal and a negative terminal of a battery module according to yet another aspect of the present disclosure comprises measuring a cell voltage of each of the plurality of battery cells, determining a reference cell voltage based on the cell voltage of at least one battery cell included in a series cell circuit of the remaining battery cells except a bottommost cell among the plurality of battery cells, wherein the bottommost cell is used as power for operating a battery controller for the battery module, determining a first duty cycle based on a reference voltage difference that is a voltage obtained by subtracting the first cell voltage from the reference cell voltage, when the reference cell voltage is higher than the first cell voltage of the bottommost cell, and outputting a balancing control signal having the first duty cycle to a discharge switch of a balancing circuit connected in parallel to the series cell circuit.

The battery balancing method may further comprise determining a second duty cycle based on a difference between a threshold cell voltage and the reference cell voltage and the first duty cycle, when the reference cell voltage is lower than the threshold cell voltage, the second duty cycle being smaller than the first duty cycle, and outputting the balancing control signal having the second duty cycle to the discharge switch.

Advantageous Effects

According to at least one of the embodiments of the present disclosure, instead of the module voltage of the battery module, the cell voltage of a specific battery cell (e.g., a battery cell located at the lowest position) included in the battery module may be used as the operating power of the battery controller. Therefore, it is possible to wake up the battery controller without adding a power supply circuit to convert the module voltage to the rated voltage required to wake up the battery controller.

The effects of the present disclosure are not limited to the above-mentioned effects, and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the following detailed description of the present disclosure, serve to provide a further understanding of the technical aspects of the present disclosure, and thus the present disclosure should not be construed as limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term "control unit" as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 1:
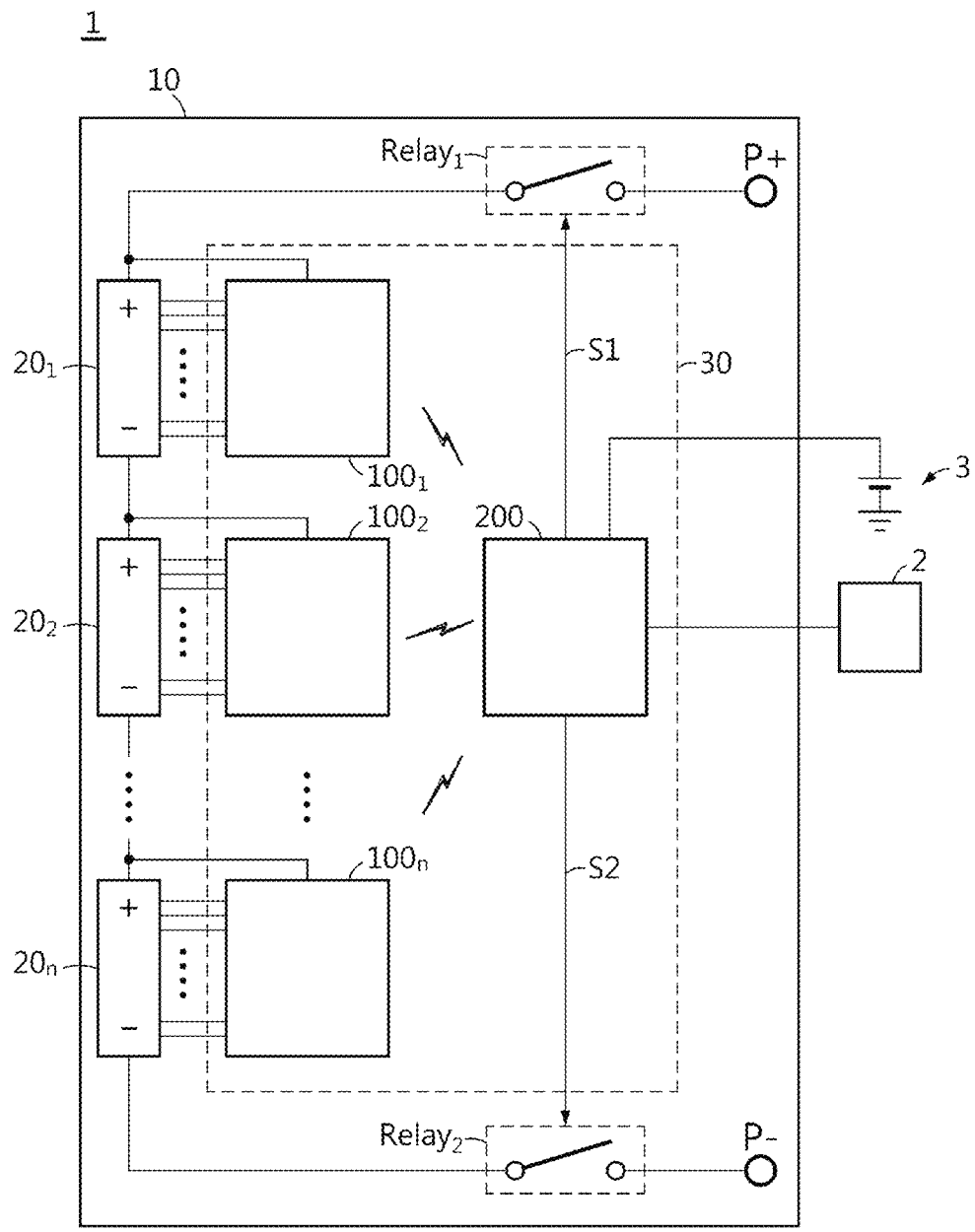
FIG. 1 is a schematic diagram showing a configuration of a battery pack according to an embodiment of the present disclosure.

FIG. 1 is a schematic diagram showing a configuration of a battery pack according to the present disclosure.

Referring to FIG. 1, the battery pack 10 includes a plurality of battery modules $20_1$ to $20_n$ (n is a natural number of 2 or greater), at least one relay $Relay_1$, $Relay_2$ and a wireless battery control system 30. The battery pack 10 may be mounted on an electrical system 1 (e.g., an electric vehicle) to supply power required for the operation of the electrical system.

Figure 3:
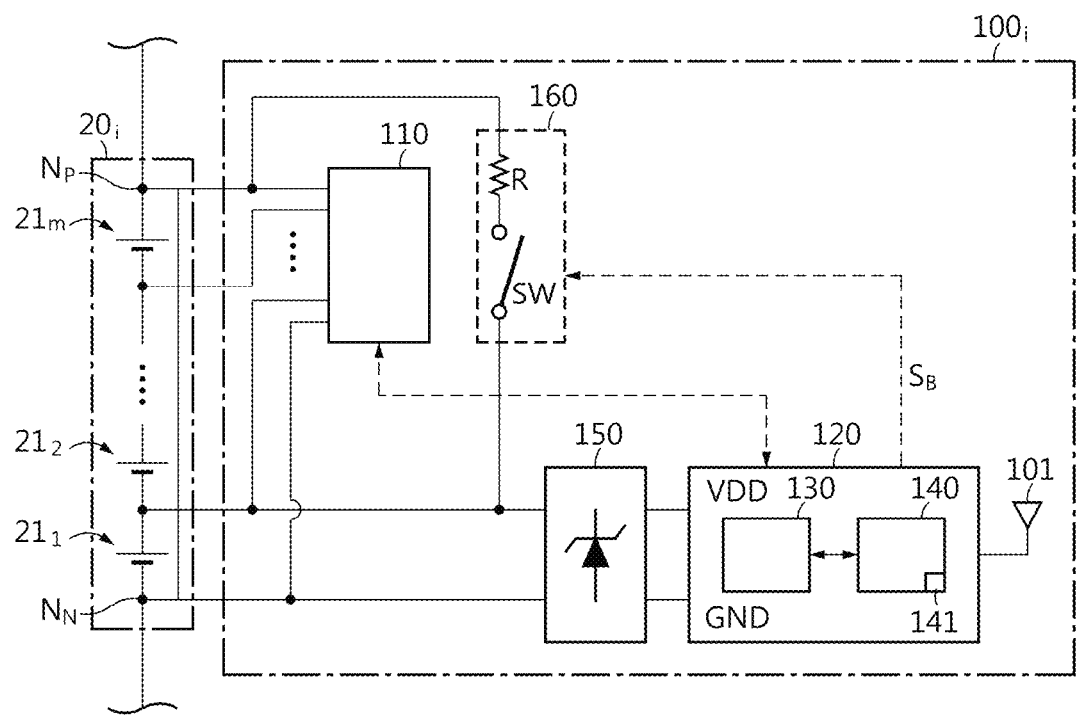
FIG. 3 is a schematic diagram showing a configuration of a slave according to a first embodiment of the present disclosure.

Each of the battery modules $20_1$ to $20_n$ may include battery cells $21_1$ to $21_m$ (see FIG. 3).

The relay $Relay_1$ may be installed on a large current path on the side of a positive terminal (P+) of the battery pack 10. The relay $Relay_2$ may be installed on a large current path on the side of a negative terminal (P−) of the battery pack 10. Any one of the relay $Relay_1$ and the relay $Relay_2$ may be removed from the battery pack 10 where necessary.

The wireless battery control system 30 includes a plurality of controllers $100_1$ to $100_n$ and a controller 200. Hereinafter, each of the plurality of battery controllers $100_1$ to $100_n$ is referred to as "slave", and the controller 200 is referred to as 'master'.

The slaves $100_1$ to $100_n$ are electrically connected to the battery modules $20_1$ to $20_n$ in a one-to-one relationship.

Where i=1 to n, the slave $100_i$ is electrically connected to the battery module $20_i$ to monitor the state of the battery module $20_i$.

The slave $100_i$ is configured to measure a module parameter associated with the state of the battery module $20_i$. For example, the module voltage of the battery module $20_i$ and the cell voltage of each of the plurality of battery cells $21_1$ to $21_m$ included in the battery module $20_i$ may be measured as the module parameter of the battery module $20_i$.

The slave $100_i$ performs a variety of functions (for example, balancing) for controlling the state of the battery module $20_i$. Each function may be directly performed by the slave $100_i$ based on the state of the battery module $20_i$ or may be performed in response to a command from the master 200.

The master 200 may be coupled to each of the slaves $100_1$ to $100_n$ to enable wireless communication. The master 200 receives sensing data wirelessly transmitted from the slaves $100_1$ to $100_n$. In addition, the master 200 wirelessly transmits the command for controlling the state of at least one of the slaves $100_1$ to $100_n$ based on the sensing data from the slaves $100_1$ to $100_n$.

Figure 2:
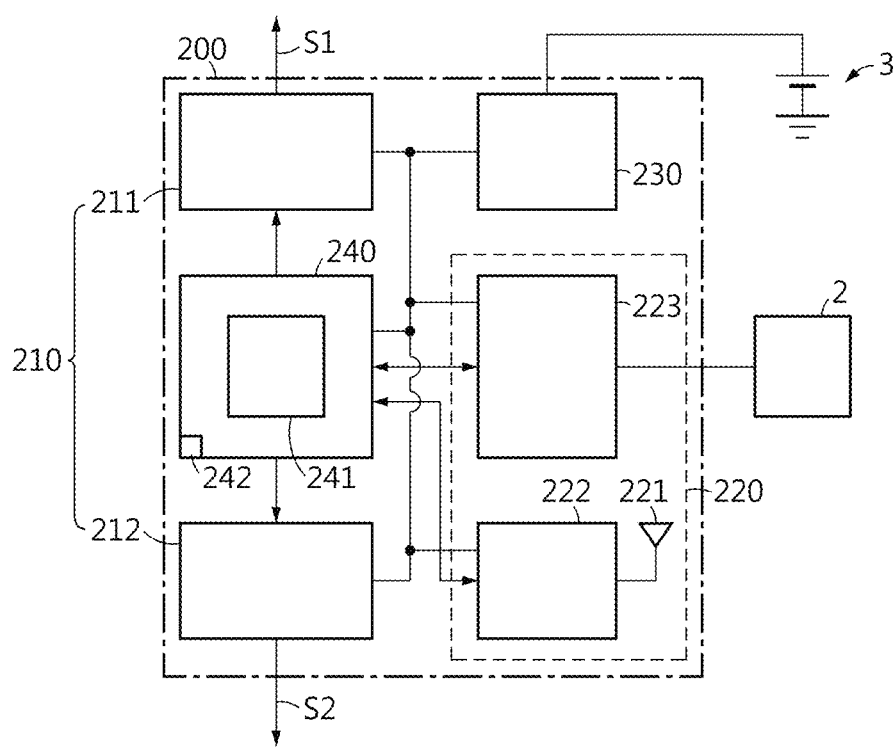
FIG. 2 is a schematic diagram showing a configuration of a master shown in FIG. 1.

FIG. 2 is a schematic diagram showing a configuration of the master 200 shown in FIG. 1.

Referring to FIG. 2, the master 200 may include a relay driving unit 210, a communication unit 220, a power supply unit 230 and a control unit 240.

The relay driving unit 210 is configured to control the relays $Relay_1$, $Relay_2$. The relay driving unit 210 may include relay driving circuits 211, 212. The relay drive circuit 211 turns on or off the relay $Relay_1$ by outputting a switching signal S1 having a first duty cycle corresponding to a first command from the control unit 240 to the relay $Relay_1$. The relay driving circuit 212 turns on or off the relay $Relay_2$ by outputting a switching signal S2 having a second duty cycle corresponding to a second command from the control unit 240 to the relay $Relay_2$.

The communication unit 220 includes an antenna 221, a wireless communication circuit 222 and a wired communication circuit 223. The wireless communication circuit 222 is operably connected to each of the antenna 221 and the wired communication circuit 223. The wireless communication circuit 222 may demodulate a signal wirelessly received through the antenna 221. The wireless communication circuit 222 may modulate a signal that will be transmitted to the slave $100_i$ and wirelessly transmit the modulated signal through the antenna 222. The antenna 221 may wirelessly transmit a signal corresponding to the signal modulated by the communication unit 220 to the slave $100_i$.

The wired communication circuit 223 is coupled to enable two-way communication with an external device 2. The wired communication circuit 223 wiredly transmits a signal received from the external device 2 to the control unit 240. In addition, the wired communication circuit 223 wiredly transmits a signal received from the control unit 240 to the external device 2. For example, the wired communication circuit 223 may communicate with the external device 2 using a controller network area (CAN).

The power supply unit 230 generates an operating voltage using power supplied from an external power source 3 (e.g., a lead acid battery of the electrical system 1). The operating voltage generated by the power supply unit 230 may be supplied to the relay driving unit 210, the communication unit 220 and/or the control unit 240.

The control unit 240 includes at least one processor 241 and a memory 242, and is operably connected to the communication unit 220. The memory 242 is not limited to a particular type, and may include any known information storage device capable of recording, erasing, updating and reading data. The memory 242 may include, for example, dynamic random access memory (DRAM), synchronous dynamic random access memory (SDRAM), flash memory, read-only memory (ROM), electrically erasable programmable read-only memory (EEPROM) and register. The memory 242 may store program codes defining processes that may be executed by the control module 120. The memory 242 may store an ID table. The ID table may record a correlation between the plurality of slaves $100_1$ to $100_n$ and a plurality of IDs. That is, the ID table includes the plurality of IDs allocated to the plurality of slaves $100_1$ to $100_n$ in different values.

The memory 242 may be physically separated from the control unit 240, and the memory 242 and the control unit 240 may be integrated into a semiconductor chip.

The control unit 240 is configured to control the overall operation of the master 200. In addition, the controller 240 may determine the State Of Charge (SOC) and/or State Of Health (SOH) of each of the battery modules $20_1$ to $20_n$ based on the module parameter of each of the slaves $100_1$ to $100_n$ wirelessly received through the antenna 221. Further, the control unit 240 generates a message for controlling the charge, discharge and/or balancing of at least one of the battery modules $20_1$ to $20_n$ based on the SOC and/or SOH of each of the battery modules $20_1$ to $20_n$. The message generated by the control unit 240 may be transmitted to the slave (e.g., $100_j$) corresponding to the battery module (e.g., $20_j$) to control using the message.

The processor 241 may selectively include a processor, an application-specific integrated circuit (ASIC), other chipset, a logic circuit, a register, a communication modem and a data processing device, well-known in the technical field to execute various control logics. At least one of the various control logics of the processor 241 may be combined together, and the combined control logics may be written in computer-readable code and stored in a computer-readable recording medium.

FIG. 3 is a schematic diagram showing a configuration of the slave according to a first embodiment of the present disclosure.

Referring to FIG. 3, the slave $100_i$ is electrically connected to the battery module $20_i$.

The battery module $20_i$ includes the plurality of battery cells $21_1$ to $21_m$ (m is a natural number of 2 or greater). Each of the battery cells $21_1$ to $21_m$ may be, for example, a lithium ion cell. The type of the battery cell is not limited to the lithium ion battery.

The battery cell is not limited to a particular type, and may include any type of battery cell that may be recharged repeatedly. The battery cells $21_1$ to $21_m$ are electrically connected in series between a node $N_N$ and a node $N_P$. The node $N_N$ may be a negative terminal of the battery module $20_i$. The node $N_P$ may be a positive terminal of the battery module $20_i$. Each of the battery cells $21_1$ to $21_m$ may have, for example, the cell voltage in the range of 3.0 to 4.5V.

Where $1 \le x < y \le m$, the battery cell $21_x$ is electrically closer to the node $N_N$ and electrically farther away from the node $N_P$ than the battery cell $21_y$. That is, a voltage between the negative terminal (or the positive terminal) of the battery cell $21_x$ and the node $N_N$ is lower than a voltage between the negative terminal (or the positive terminal) of the battery cell $21_y$ and the node $N_N$. A voltage between the negative terminal (or the positive terminal) of the battery cell $21_x$ and the node $N_P$ is higher than a voltage between the negative terminal (or the positive terminal) of the battery cell $21_y$ and the node $N_P$. The battery cell $21_1$ may be referred to as "a bottommost cell (or a first battery cell)" of the battery module $20_i$. The battery cell $21_m$ may be referred to as "a topmost cell" of the battery module $20_i$.

The slave $100_i$ includes an antenna 101, a voltage measuring unit 110 and a control module 120. The slave $100_i$ may further include at least one of a protection circuit 150 and a balancing circuit 160.

The voltage measuring unit 110 is configured to measure the cell voltage of each of the battery cells $21_1$ to $21_m$ included in the battery module $20_i$. To this end, the voltage measuring unit 110 may be electrically connected to the positive terminal and the negative terminal of each of the battery cells $21_1$ to $21_m$ through a plurality of sensing lines.

The voltage measuring unit 110 may measure the module voltage of the battery module $20_i$. The module voltage may be a voltage between the node $N_N$ and the node $N_P$.

The control module 120 may be referred to as 'RF-SoC', and includes a power input terminal VDD, a reference terminal GND, a wireless communication circuit 130 and a processor 140.

The power input terminal VDD is electrically connected to the positive terminal of the battery cell $21_1$ located at the lowest position.

The reference terminal GND is electrically connected to the node $N_N$. The voltage between the power input terminal VDD and the reference terminal GND, namely, the cell voltage of the battery cell $21_1$ is provided as the operating power of the control module 120.

The protection circuit 150 may be electrically connected between the positive terminal of the battery cell $21_1$ and the power input terminal VDD. That is, the protection circuit 150 may be electrically connected to an electrical line connecting the positive terminal of the battery cell $21_1$ and the power input terminal VDD.

The protection circuit 150 is configured to regulate the maximum value of voltage applied to the power input terminal VDD to a predetermined set voltage (for example, 3.6V). For example, when the cell voltage of the battery cell $21_1$ is equal to or lower than the set voltage, the cell voltage of the battery cell $21_1$ may be applied to the power input terminal VDD through the protection circuit 150. On the contrary, when the cell voltage of the battery cell $21_1$ is higher than the set voltage, the set voltage rather than the cell voltage of the battery cell $21_1$ may be applied to the power input terminal VDD through the protection circuit 150.

The protection circuit 150 may include a Zener diode including a first end and a second end. The first end (e.g., the cathode) of the Zener diode may be electrically connected to the positive terminal of the battery cell $21_1$, and the second end (for example, the anode) of the Zener diode may be electrically connected to the power input terminal VDD. The voltage between the power input terminal VDD and the reference terminal GND may be regulated below the set voltage by the breakdown voltage (e.g., 1.0) of the Zener diode.

Alternatively, the first end of the Zener diode may be electrically connected to the power input terminal VDD, and the second end of the Zener diode may be electrically connected to the reference terminal GND. In this case, the breakdown voltage (e.g., 3.6V) of the Zener diode may be equal to or lower than the set voltage.

The wireless communication circuit 130 is electrically connected to the antenna 101. The wireless communication circuit 130 demodulates a radio signal received by the antenna 101. The wireless communication circuit 130 may modulate a signal from the processor 140 and provide the modulated signal to the antenna 101. The antenna 101 may wirelessly transmit the modulated signal to the master 200.

The processor 140 is operably coupled to the voltage measuring unit 110 and the wireless communication circuit 130, and may include a memory 141.

The memory 141 is not limited to a particular type, and may include any known information storage device capable of recording, erasing, updating and reading data. The memory 141 may include, for example, DRAM, SDRAM, flash memory, ROM, EEPROM and register. The memory 141 may store program codes defining processes that may be executed by the processor 140. The memory 141 stores an ID allocated to the slave $100_i$. The ID stored in the memory 141 may be used for wireless communication of the slave $100_i$ with the master 200. The memory 141 may be physically separated from the processor 140, and the memory 141 and the processor 140 may be integrated into a chip.

The processor 140 provides the wireless communication circuit 130 with data indicating a voltage signal from the voltage measuring unit 110. The voltage signal indicates the cell voltage of each of the battery cells $21_1$ to $21_m$ measured by the voltage measuring unit 110. The wireless communication circuit 130 may modulate the data indicating the voltage signal, and wirelessly transmit the modulated data as the sensing data to the master 200 through the antenna 101.

The processor 140 may selectively include a processor, an ASIC, other chipset, a logic circuit, a register, a communication modem and a data processing device, well-known in the technical field to execute various control logics. At least one of the various control logics of the control module 120 may be combined together, and the combined control logics may be written in computer-readable code and recorded on a computer-readable recording medium. The recording medium is not limited to a particular type, and may include any type of recording medium that is accessible by the processor included in the computer.

As described above, in the battery module $20_i$, only the battery cell $21_1$ among the battery cells $21_1$ to $21_m$ is used as power for operating the control module 120, which makes a large difference in SOC between the battery cell $21_1$ and the remaining battery cells $21_2$ to $21_m$. For SOC balancing between the battery cells $21_2$ to $21_m$ and the battery cell $21_1$, the balancing circuit 160 is configured to selectively form a discharge path for the battery cells $21_2$ to $21_m$ except the battery cell $21_1$.

The balancing circuit 160 is electrically connected in parallel to the battery cells $21_2$ to $21_m$. That is, among the battery cells $21_1$ to $21_m$, the balancing circuit 160 is electrically connected in parallel to a series cell circuit of the battery cells $21_2$ to $21_m$ except the battery cell $21_1$. For example, the first end of the balancing circuit 160 may be electrically connected to the negative terminal of the battery cell $21_2$, and the first end of the balancing circuit 160 may be electrically connected to the positive terminal of the battery cell $21_m$.

The balancing circuit 160 includes a discharge resistor R and a discharge switch SW. The discharge resistor R and the discharge switch SW are electrically connected in series. That is, the balancing circuit 160 is a series circuit of the discharge resistor R and the discharge switch SW.

On-off of the discharge switch SW may be controlled by a balancing control signal $S_B$ from the processor 140. For example, the discharge switch SW may be turned on in response to the balancing control signal $S_B$ having a predetermined high level voltage. On the contrary, the discharge switch SW may be turned off in response to the balancing control signal $S_B$ having a low level voltage. The balancing control signal $S_B$ may be a Pulse Width Modulation (PWM) signal. While the discharging switch SW is turned on, electrical energy of the battery cells $21_2$ to $21_m$ is consumed by the discharge resistance R, and thus the SOC of each of the battery cells $21_2$ to $21_m$ gradually decreases.

The processor 140 determines a reference cell voltage based on the cell voltage of at least one of the battery cells $21_2$ to $21_m$. As an example, the reference cell voltage may be equal to the cell voltage of any one battery cell (for example, $21_2$) of the battery cells $21_2$ to $21_m$. As another example, the reference cell voltage may be an average cell voltage of at least two of the battery cells $21_2$ to $21_m$.

Subsequently, the processor 140 controls the duty cycle of the balancing control signal $S_B$ based on a reference voltage difference which is a difference between the reference cell voltage and the cell voltage of the battery cell $21_1$. The duty cycle is a percentage or a ratio of the pulse active time (for example, the high level voltage) to the time length of one period of the balancing control signal $S_B$. For example, when one period is 0.01 sec and the pulse active time is 0.005 sec, the duty cycle of the balancing control signal $S_B$ is 0.5 (or 50%). As the duty cycle of the balancing control signal $S_B$ is higher, the battery cells $21_2$ to $21_m$ are discharged faster.

As the reference voltage difference is larger, the processor 140 may increase the duty cycle of the balancing control signal $S_B$. When the reference cell voltage is higher than the cell voltage of the battery cell $21_1$, the processor 140 may reduce the duty cycle of the balancing control signal $S_B$ as the reference voltage difference is smaller. For example, a relationship between the reference voltage difference and the duty cycle of the balancing control signal $S_B$ may be expressed by the following Equation 1.

$$D_{B\_V} = \Delta V_1 \times C_1 \quad \text{[Equation 1]}$$

$D_{B\_V}$ denotes the duty cycle of the balancing control signal $S_B$, $\Delta V_1$ denotes the reference voltage difference, and $C_1$ denotes a predetermined scaling factor. The reference voltage difference may be periodically determined every predetermined monitoring period (e.g., 1.0 sec) during the operation of the control module 120. In addition, the operation of determining the duty cycle of the balancing control signal $S_B$ based on the reference voltage difference may be repeated every predetermined monitoring period.

Accordingly, the processor 140 may balance (reduce) the SOC difference between the battery cells $21_2$ to $21_m$ and the battery cell $21_1$ by increasing the duty cycle of the balancing control signal $S_B$ while the SOC of the battery cell $21_1$ decreases rapidly due to the increasing power consumption from the battery cell $21_1$ by the control module 120. On the contrary, the processor 140 may gradually reduce the duty cycle of the balancing control signal $S_B$ while the SOC of the battery cell $21_1$ decreases slowly due to the low power consumption of the control module 120.

Figure 4:
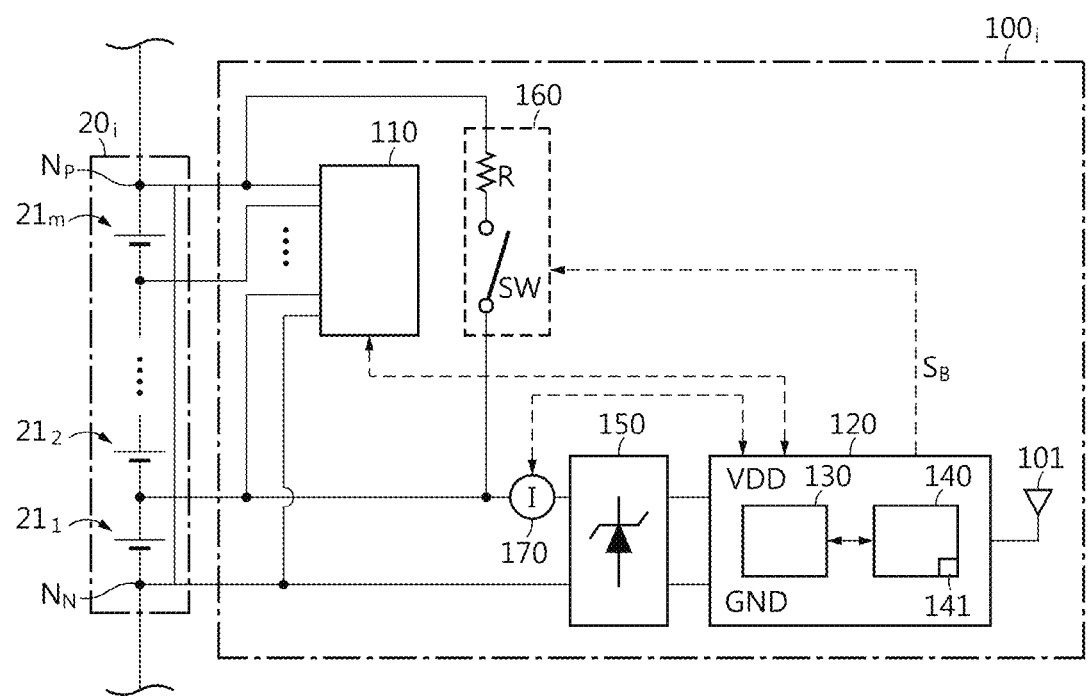
FIG. 4 is a schematic diagram showing a configuration of a slave according to a second embodiment of the present disclosure.

FIG. 4 is a schematic diagram showing a configuration of the slave according to a second embodiment of the present disclosure. The slave 100 according to the second embodiment will be described based on differences from the first embodiment (see FIG. 3) to avoid redundancy.

Unlike the first embodiment, the slave 100 of the second embodiment further includes a current sensor 170, and controls the duty cycle of the balancing control signal $S_B$ based on the current measured by the current sensor 170.

Referring to FIG. 4, the current sensor 170 is installed on a power supply path between the battery cell $21_1$ and the control module 120. That is, the current sensor 170 may be disposed on an electrical line connecting the positive terminal of the battery cell $21_1$ and the power input terminal VDD, or an electrical line connecting the negative terminal of the battery cell $21_1$ and the reference terminal GND. For example, the current sensor 170 may be disposed on a current path between the positive terminal of the battery cell $21_1$ and the first end of the protection circuit 150.

The current sensor 170 measures the current flowing through the power supply path between the battery cell $21_1$ and the control module 120, and generates a current signal indicating the measured current. The current sensor 170 may include a shunt resistor or a hall effect sensor.

The processor 140 is operably coupled to the current sensor 170. The processor 140 may control the duty cycle of the balancing control signal S B based on the current signal from the current sensor 170.

In detail, the processor 140 determines, based on the current signal, the discharge capacity of the battery cell $21_1$ consumed as the power for operating the control module 120 fore eachy predetermined monitoring period (for example, 1.0 sec). The discharge capacity of a certain monitoring period may be the cumulative amount of current measured at each unit time (for example, 0.0001 sec) by the current sensor 170 during the corresponding monitoring period. The processor 140 may determine the duty cycle of the balancing control signal $S_B$ for the next monitoring period based on the discharge capacity of the latest monitoring period. For example, as the discharge capacity of the previous monitoring period increases, the duty cycle of the balancing control signal $S_B$ for the next monitoring period may increase. A relationship between the discharge capacity of the previous monitoring period and the duty cycle of the next monitoring period may be expressed by the following Equation 2.

$$D_{B\_I} = \Delta Q \times C_2 \quad \text{[Equation 2]}$$

In Equation 2, $D_{B\_I}$ denotes the duty cycle of the balancing control signal $S_B$ of the next monitoring period, $\Delta Q$ denotes the discharge capacity of the previous monitoring period, and $C_2$ denotes a predetermined scaling factor.

For example, assume that $C_2$=0.03%/mAh. According to Equation 2, where $\Delta Q$=100 mAh for the first monitoring period, the duty cycle is maintained at 3.0% during the second monitoring period following the first monitoring period. In addition, where ΔQ=90 mAh for the second monitoring period, the duty cycle is maintained at 2.7% during the third monitoring period following the second monitoring period. In addition, where ΔQ=120 mAh for the third monitoring period, the duty cycle is maintained at 3.6% during the fourth monitoring period following the third monitoring period.

Alternatively, the processor 140 may determine the duty cycle of the next monitoring period based on the reference voltage difference and the discharge capacity of the previous monitoring period. A relationship between the reference voltage difference, the previous discharge capacity and the next duty cycle may be expressed by the following Equation 3. Equation 3 is a combination of Equation 1 and Equation 2.

$$D_{B\_VT} = (\Delta V_1 \times C_1) \times W_1 + (\Delta Q \times C_2) \times W_2 \quad \text{[Equation 3]}$$

$W_1$ and $W_2$ are predetermined weights having the same or different positive values. For example, $W_2=1-W_1$. For example, assume that $\Delta V_1=10$ mV, $C_1=0.2$ [%/mV], $C_2=0.03$ [%/mAh], $W_1=0.5$, $W_2=0.5$. According to Equation 3, where ΔQ=100 mAh, the duty cycle may be maintained at 2.5% during the next monitoring period, and where ΔQ=200 mAh, the duty cycle may be maintained at 4.0% during the next monitoring period.

In at least one of the first embodiment and second embodiment, when the reference cell voltage is equal to or lower than the cell voltage of the battery cell $21_1$ (the reference voltage difference≤0V), the processor 140 may set the duty cycle of the balancing control signal $S_B$ to 0. While the duty cycle is 0, the discharge switch SW is kept off.

Figure 5:
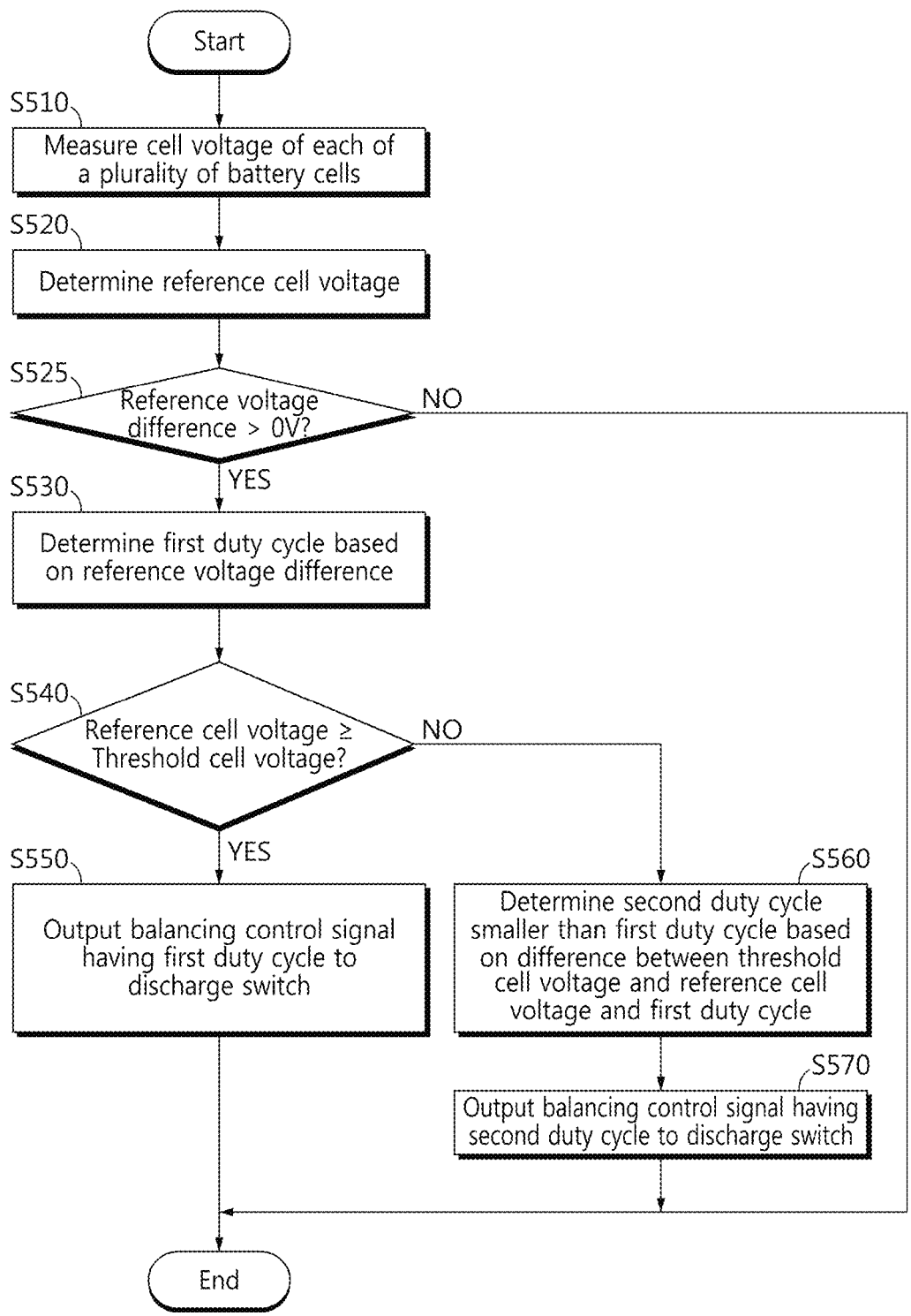
FIG. 5 is a flowchart showing a method for balancing a plurality of battery cells included in a battery module using the slave according to the first embodiment of FIG. 3.

FIG. 5 is a flowchart showing a method for balancing the plurality of battery cells included in the battery module using the slave according to the first embodiment of FIG. 3. The method of FIG. 5 may be repeated every predetermined monitoring period while the control module 120 corresponding to the slave $100_i$ is operating.

Referring to FIGS. 3 and 5, in the step S510, the processor 140 measures the cell voltage of each of the plurality of battery cells $21_1$ to $21_m$ included in the battery module $20_i$ using the voltage measuring unit 110.

In step S520, the processor 140 determines a reference voltage difference. The reference voltage difference is obtained by subtracting the first cell voltage of the first battery cell $21_1$ from a reference cell voltage. The reference cell voltage may be the cell voltage of any one (e.g., $21_2$) of the battery cells $21_2$ to $21_m$ except the battery cell $21_1$ or an average cell voltage of two or more of the battery cells $21_2$ to $21_m$.

In step S525, the processor 140 determines whether the reference voltage difference is larger than 0V or not. When a value of the step S525 is "yes", step S530 is performed. When the value of the step S525 is "no", the method may end and the duty cycle is set to 0.

In step S530, the processor 140 determines a first duty cycle based on the reference voltage difference (see Equation 1).

In step S540, the processor 140 determines whether the reference cell voltage is equal to or higher than a predetermined threshold cell voltage. The threshold cell voltage may be a predetermined voltage (e.g., 3.8V) corresponding to a predetermined SOC (e.g., 20%). A value of the step S540 being "yes" indicates that the second to $m^{th}$ battery cells $21_2$ to $21_m$ are sufficiently charged. When the value of the step S540 is "yes", step S550 is performed. The value of the step S540 being "no" indicates that at least one of the second to $m^{th}$ battery cells $21_2$ to $21_m$ may be overdischarged. When the value of the step S540 is "no", step S560 is performed.

In step S550, the processor 140 outputs a balancing control signal $S_B$ having the first duty cycle to the discharge switch SW.

In step S560, the processor 140 determines a second duty cycle based on a difference between the threshold cell voltage and the reference cell voltage, and the first duty cycle. The second duty cycle is smaller than the first duty cycle. The processor 140 may determine the second duty cycle using the following Equation 4.

$$D_{B\_V\_L} = D_{B\_V}/(\Delta V_2 \times C_3) \quad \text{[Equation 4]}$$

In Equation 4, $D_{B\_V}$ denotes the first duty cycle, $\Delta V_2$ denotes the difference between the threshold cell voltage and the reference cell voltage (i.e., Threshold cell voltage-Reference cell voltage), $C_3$ denotes a predetermined scaling factor, and $D_{B\_V\_L}$ denotes the second duty cycle. $C_3$ may be a preset positive value that makes ($\Delta V_2 \times C_3$) larger than 1. For example, when the voltage resolution of an analog to digital converter (ADC) embedded in the voltage measuring unit 110 or the processor 140 to measure the cell voltage is 1/4096 V, $C_3$ may be preset to be equal to or larger than 4096 [1/V]. From Equation 4, it can be seen that $\Delta V_2$ and $D_{B\_V\_L}$ have an inversely proportional relationship.

In step S570, the processor 140 outputs the balancing control signal $S_B$ having the second duty cycle to the discharge switch SW. In this case, it is possible to protect the second to $m^{th}$ battery cells $21_2$ to $21_m$ from overdischarge, compared to the balancing control signal $S_B$ having the first duty cycle.

In the method of FIG. 5, the steps S540, S560 and S570 may be omitted.

Figure 6:
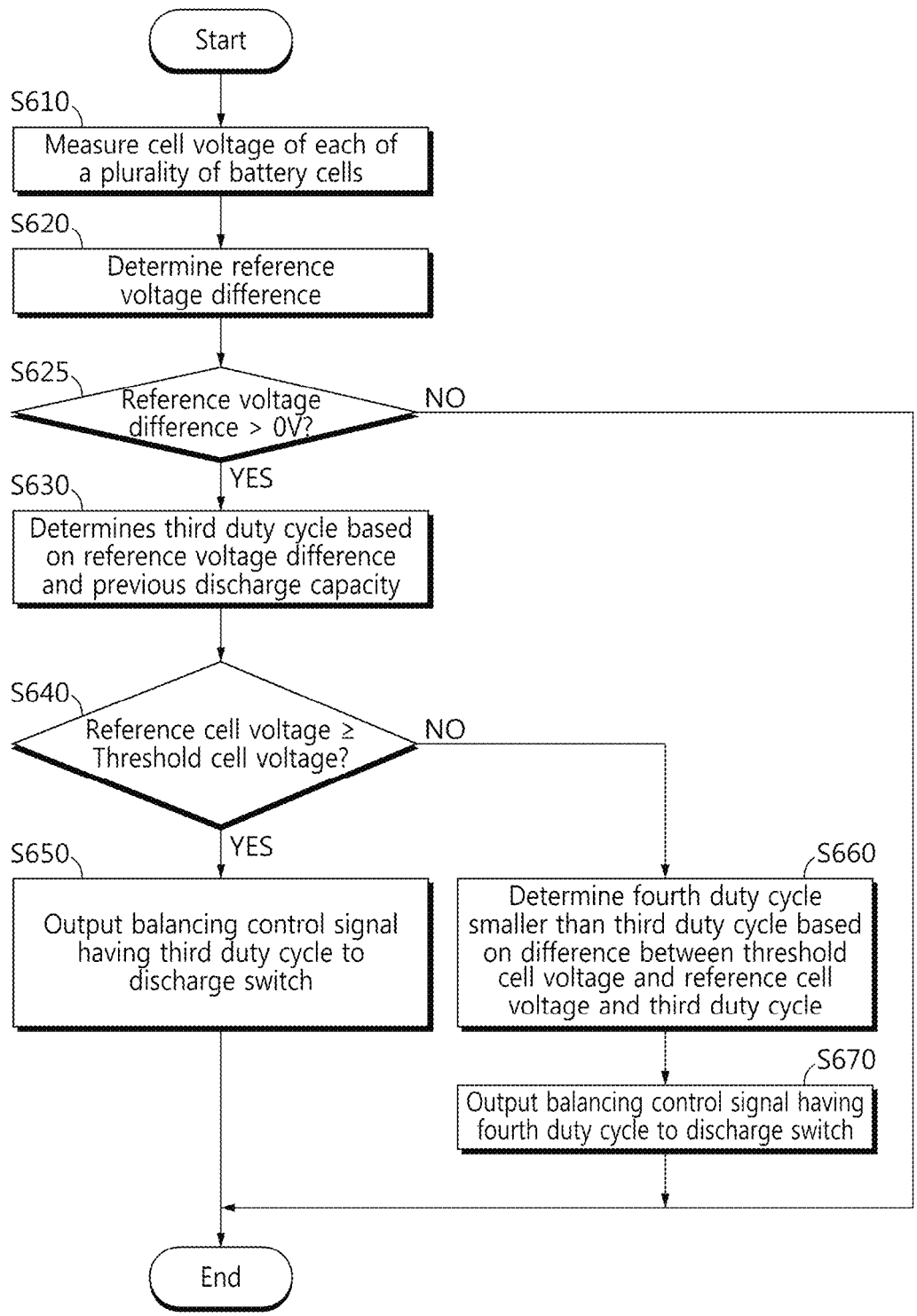
FIG. 6 is a flowchart showing a method for balancing a plurality of battery cells included in a battery module using the slave according to the second embodiment of FIG. 4.

FIG. 6 is a flowchart showing a method for balancing the plurality of battery cells included in the battery module using the slave according to the second embodiment of FIG. 4. The method of FIG. 6 may be repeated every predetermined monitoring period while the control module 120 corresponding to the slave $100_i$ is operating.

Referring to FIGS. 4 and 6, in step S610, the processor 140 measures the cell voltage of each of the plurality of battery cells $21_1$ to $21_m$ included in the battery module $20_i$ using the voltage measuring unit 110.

In step S620, the processor 140 determines a reference voltage difference. The reference voltage difference is obtained by subtracting the first cell voltage of the first battery cell $21_1$ from a reference cell voltage. The reference cell voltage may be the cell voltage of any one (e.g., $21_2$) of the battery cells $21_2$ to $21_m$ except the battery cell $21_1$ or an average cell voltage of two or more of the battery cells $21_2$ to $21_m$.

In step S625, the processor 140 determines whether the reference voltage difference is larger than 0V or not. When a value of the step S625 is "yes", step S630 is performed. When the value of the step S625 is "no", the method may end and the duty cycle is set to 0.

In step S630, the processor 140 determines a third duty cycle based on the reference voltage difference and the previous discharge capacity (see Equation 3). The previous discharge capacity may indicate the cumulative amount of current flowing through the current sensor 170 over the previous monitoring period. Before the lapse of one monitoring period from the start of wakeup of the control module 120, the discharge capacity at the step S620 may be set to a predetermined initial value (e.g., 0 mAh).

In step S640, the processor 140 determines whether the reference cell voltage is equal to or higher than a predetermined threshold cell voltage. The threshold cell voltage may be a predetermined voltage (e.g., 3.8V) corresponding to a predetermined SOC (e.g., 20%). A value of the step S640 being "yes" indicates that the second to $m^{th}$ battery cells $21_2$ to $21_m$ are sufficiently charged. When the value of the step S640 is "yes", step S650 is performed. The value of the step S640 being "no" indicates that at least one of the second to $m^{th}$ battery cells $21_2$ to $21_m$ may be overdischarged. When the value of the step S640 is "no", step S660 is performed.

In step S650, the processor 140 outputs a balancing control signal $S_B$ having the third duty cycle to the discharge switch SW.

In step S660, the processor 140 determines a fourth duty cycle based on a difference between the threshold cell voltage and the reference cell voltage, and the third duty cycle. The fourth duty cycle is smaller than the third duty cycle. The processor 140 may determine the fourth duty cycle using the following Equation 5.

$$D_{B\_VI\_L} = D_{B\_VI}/(\Delta V_2 \times C_4) \quad \text{[Equation 5]}$$

In Equation 5, $D_{B\_VI}$ denotes the third duty cycle, $\Delta V_2$ denotes the difference between the threshold cell voltage and the reference cell voltage, $C_4$ denotes a predetermined scaling factor, and $D_{B\_VI\_L}$ denotes the fourth duty cycle. $C_4$ may be a preset positive value that makes ($\Delta V_2 \times C_4$) larger than 1. For example, when the voltage resolution of the ADC embedded in the voltage measuring unit 110 or the processor 140 to measure the cell voltage is 1/4096 V, $C_4$ may be preset to be equal to or larger than 4096 [1/V]. From Equation 5, it can be seen that $\Delta V_2$ and $D_{B\_VI\_L}$ have an inversely proportional relationship.

In step S670, the processor 140 outputs the balancing control signal $S_B$ having the fourth duty cycle to the discharge switch SW. In this case, it is possible to protect the second to $m^{th}$ battery cells $21_2$ to $21_m$ from overdischarge, compared to the balancing control signal $S_B$ having the third duty cycle.

In the method of FIG. 6, the steps S640, S660 and S670 may be omitted.

The embodiments of the present disclosure described hereinabove are not implemented only through the apparatus, and may be implemented through programs that realize the functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

In addition, many substitutions, modifications and changes may be made to the present disclosure by those skilled in the art without departing from the technical aspects of the present disclosure, and the present disclosure is not limited to the foregoing embodiments and the accompanying drawings, and some or all of the embodiments may be selectively combined to make various modifications to the present disclosure.

What is claimed is:

1. A battery controller for a battery module comprising a positive terminal, a negative terminal, and a plurality of battery cells electrically connected in series between the positive terminal and the negative terminal, the battery controller comprising:
   a voltage measuring unit configured to generate a voltage signal indicating a cell voltage of each of the plurality of battery cells; and
   a control module operably coupled to the voltage measuring unit, the control module being configured to:
      wake up using only a first cell voltage of a bottommost cell, among the plurality of battery cells, as power for operating the control module; and
      wirelessly transmit sensing data indicating the cell voltage of each of the plurality of battery cells while the control module is operating.

2. The battery controller according to claim 1, wherein the control module comprises:
   a power input terminal electrically connected to a positive terminal of the bottommost cell; and
   a reference terminal electrically connected to a negative terminal of the bottommost cell.

3. The battery controller according to claim 2, further comprising a protection circuit electrically connected between the positive terminal of the bottommost cell and the power input terminal, the protection circuit being configured to regulate a voltage between the power input terminal and the reference terminal equal to or less than a predetermined set voltage.

4. The battery controller according to claim 3, wherein the protection circuit comprises a Zener diode, the Zener diode comprising:
   a first end electrically connected to the positive terminal of the bottommost cell; and
   a second end electrically connected to the power input terminal.

5. A battery controller for a battery module comprising a positive terminal, a negative terminal, and a plurality of battery cells electrically connected in series between the positive terminal and the negative terminal, the battery controller comprising:
   comprising:
   a voltage measuring unit configured to generate a voltage signal indicating a cell voltage of each of the plurality of battery cells; and
   a control module operably coupled to the voltage measuring unit, the control module being configured to:
      wake up using a first cell voltage of a bottommost cell, among the plurality of battery cells, as power for operating the control module; and
      wirelessly transmit sensing data indicating the cell voltage of each of the plurality of battery cells while the control module is operating; and
   a balancing circuit electrically connected in parallel to a series cell circuit of the remaining battery cells, except for the bottommost cell, among the plurality of battery cells.

6. The battery controller according to claim 5, wherein the control module is further configured to:
   determine a reference cell voltage based on the cell voltage of at least one battery cell included in the series cell circuit; and
   output a balancing control signal to the balancing circuit when the reference cell voltage is higher than the first cell voltage,
   wherein the balancing circuit is configured to form a discharge path for the series cell circuit in response to the balancing control signal.

7. The battery controller according to claim 6, wherein the balancing circuit comprises:
a discharge resistor; and
a discharge switch connected in series to the discharge resistor, the discharge switch being configured to be turned on in response to the balancing control signal.

8. The battery controller according to claim 6, wherein the control module is further configured to determine a duty cycle of the balancing control signal based on a reference voltage difference that is a voltage obtained by subtracting the first cell voltage from the reference cell voltage.

9. The battery controller according to claim 8, wherein the control module is configured to determine the duty cycle using the following Equation 1:

$$D_{B\_V} = \Delta V_1 \times C_1, \quad \text{[Equation 1]}$$

where:
$D_{B\_V}$ is the duty cycle,
$\Delta V_1$ is the reference voltage difference, and
$C_1$ is a predetermined scaling factor.

10. The battery controller according to claim 8, further comprising:
a current sensor configured to generate a current signal indicating a current flowing from a positive terminal of the bottommost cell to a power input terminal of the control module electrically connected to the positive terminal of the bottommost cell,
wherein the control module is further configured to determine the duty cycle of the balancing control signal further based on the current signal.

11. The battery controller according to claim 10, wherein the control module is further configured to:
determine, based on the current signal, a discharge capacity of the bottommost cell for each predetermined monitoring period; and
determine the duty cycle using the following Equation 2:

$$D_{B\_VI} = (\Delta V_1 \times C_1) \times W_1 + (\Delta Q \times C_2) \times W_2, \quad \text{[Equation 2]}$$

where:
$D_{B\_VI}$ is the duty cycle,
$\Delta V_1$ is the reference voltage difference,
$C_1$ is a predetermined first scaling factor,
$\Delta Q$ is the discharge capacity,
$C_2$ is a predetermined second scaling factor,
$W_1$ is a predetermined first weight, and
$W_2$ is a predetermined second weight.

12. A wireless battery control system comprising the battery controller according to claim 5.

13. A battery pack comprising the wireless battery control system according to claim 12.

14. A wireless battery control system comprising the battery controller according to claim 1.

15. A battery pack comprising the wireless battery control system according to claim 14.

16. A battery balancing method for a plurality of battery cells connected in series between a positive terminal and a negative terminal of a battery module, the battery balancing method comprising:
measuring a cell voltage of each of the plurality of battery cells;
determining a reference cell voltage based on the cell voltage of at least one battery cell included in a series cell circuit of the battery cells, except for a bottommost cell among the plurality of battery cells, the bottommost cell being used as power for operating a battery controller for the battery module;
determining a first duty cycle based on a reference voltage difference that is a voltage obtained by subtracting the first cell voltage from the reference cell voltage, when the reference cell voltage is higher than the first cell voltage of the bottommost cell; and
outputting a balancing control signal, having the first duty cycle, to a discharge switch of a balancing circuit connected in parallel to the series cell circuit.

17. The battery balancing method according to claim 16, further comprising:
determining a second duty cycle based on a difference between a threshold cell voltage and the reference cell voltage and the first duty cycle, when the reference cell voltage is lower than the threshold cell voltage, the second duty cycle being smaller than the first duty cycle; and
outputting the balancing control signal, having the second duty cycle, to the discharge switch.

* * * * *